United States Patent
Hennig

(10) Patent No.: US 7,606,544 B2
(45) Date of Patent: Oct. 20, 2009

(54) SYSTEM FOR DYNAMIC CONTROL OF AUTOMATIC GAIN CONTROL TAKE-OVER-POINT AND METHOD OF OPERATION

(75) Inventor: Andreas G. Hennig, Lenting (DE)

(73) Assignee: Microtune (Texas), L.P., Plano, TX (US)

( * ) Notice: Subject to any disclaimer, the term of this patent is extended or adjusted under 35 U.S.C. 154(b) by 334 days.

(21) Appl. No.: 11/023,691

(22) Filed: Dec. 28, 2004

(65) Prior Publication Data

US 2006/0141965 A1 Jun. 29, 2006

(51) Int. Cl.
*H04B 7/00* (2006.01)
(52) U.S. Cl. .............. 455/247.1; 455/234.2; 455/245.2; 455/250.1; 455/251.1; 330/129; 330/280; 375/345
(58) Field of Classification Search ... 455/232.1–253.2; 375/345, 245; 348/725; 330/129, 280
See application file for complete search history.

(56) References Cited

U.S. PATENT DOCUMENTS

| | | | | |
|---|---|---|---|---|
| 5,572,264 | A * | 11/1996 | Mizukami et al. | 348/735 |
| 5,862,465 | A * | 1/1999 | Ou | 455/234.1 |
| 5,999,559 | A | 12/1999 | Takaki | 375/200 |
| 6,118,499 | A * | 9/2000 | Fang | 348/726 |
| 6,181,201 | B1 * | 1/2001 | Black | 330/129 |
| 6,373,907 | B1 * | 4/2002 | Katsura et al. | 375/345 |
| 6,650,878 | B1 * | 11/2003 | Abe et al. | 455/232.1 |
| 6,728,524 | B2 * | 4/2004 | Yamanaka et al. | 455/232.1 |
| 6,882,693 | B2 * | 4/2005 | Ozeki et al. | 375/345 |
| 6,950,641 | B2 * | 9/2005 | Gu | 455/241.1 |
| 6,996,386 | B2 * | 2/2006 | Yamanaka | 455/234.2 |
| 7,271,852 | B2 * | 9/2007 | Paik et al. | 348/725 |
| 2003/0064696 | A1 * | 4/2003 | Akamine et al. | 455/311 |

FOREIGN PATENT DOCUMENTS

| | | |
|---|---|---|
| EP | 1 089 429 A2 | 4/2001 |
| EP | 1 089 429 A3 | 4/2001 |
| EP | 1 217 729 A2 | 11/2001 |
| EP | 1 267 488 A2 | 12/2002 |
| EP | 1 267 488 A3 | 12/2002 |
| GB | 2 371 690 A | 7/2002 |

OTHER PUBLICATIONS

*Notification of Transmittal of the International Search Report and the Written Opinion of the International Searching Authority, or the Declaration* for International Application No. PCT/US05/47242; 8 pages, Feb. 12, 2007.
*European Patent Office; Summons to attend oral proceedings pursuant to Rule 115(1)EPC* for Application No. 05251659.8-2215/1679792; 8 pages, Sep. 24, 2008.
*European Patent Office; Decision to Refuse a European Patent Application* for Application No. 05 251 659.8 - 2215; 28 pages, Jan. 14, 2009.

* cited by examiner

*Primary Examiner*—Edward Urban
*Assistant Examiner*—Junpeng Chen
(74) *Attorney, Agent, or Firm*—Baker Botts L.L.P.

(57) ABSTRACT

A receiver for processing a signal comprises a first amplifier circuit and a second amplifier circuit. The first amplifier circuit is operated in association with a first gain profile. The second amplifier circuit is operated in association with a second gain profile. The receiver further comprises a gain control circuit that determines a quality indicator associated with a modulated signal. The gain control circuit adjusts the first gain profile and the second gain profile based at least in part upon the determined quality indicator.

36 Claims, 3 Drawing Sheets

SYSTEM FOR DYNAMIC CONTROL OF AUTOMATIC GAIN CONTROL TAKE-OVER-POINT AND METHOD OF OPERATION

TECHNICAL FIELD OF THE INVENTION

This invention relates in general to signal processing, and more particularly to a system for dynamic control of automatic gain control take-over-point.

BACKGROUND OF THE INVENTION

One problem with receiving television signals is the presence of strong adjacent channels surrounding a channel-of-interest. Those adjacent channels are not taken into account when determining the gain of a receiver. By default, therefore, the gain of the two or more variable gain stages of a receiver are set to achieve the best sensitivity for the receiver. Typically, the gain of a first variable gain stage in the receiver is kept at a maximum as long as possible. The following variable gain stage(s) may be used to adjust the signal level according to the input level required by the demodulator. Only when the level of the desired signal becomes too strong is the gain of the first variable gain stage reduced to keep the signal levels within the linear range of the receiver. The point where the gain control is changed from the succeeding variable gain stage(s) to the first variable gain stage is called the "take-over-point" (TOP). However, when using the default TOP in the presence of strong adjacent channels, the input stages of the receiver can be overdriven and the quality of the desired signal can be degraded.

SUMMARY OF THE INVENTION

In accordance with the present invention, the disadvantages and problems associated with prior receivers have been substantially reduced or eliminated.

In accordance with one embodiment of the present invention, a receiver for processing a signal comprises a first amplifier circuit and a second amplifier circuit. The first amplifier circuit is operated in association with a first gain profile. The second amplifier circuit is operated in association with a second gain profile. The receiver further comprises a gain control circuit that determines a quality indicator associated with a modulated signal. The gain control circuit adjusts the first gain profile and the second gain profile based at least in part upon the determined quality indicator of the modulated signal. The quality of the modulated signal can be indicated using one or more of the Signal-to-Noise Ratio (SNR), the Error-Vector-Magnitude (EVM), the Modulation-Error-Ratio (MER), the Mean-Square-Error (MSE), or any other similar quality indicator of the modulated signal.

The following technical advantages may be achieved by some, none, or all of the embodiments of the present invention. A gain control circuit of a receiver is coupled to a first amplifier circuit and a second amplifier circuit. In general, the first amplifier circuit and the second amplifier circuit operate in conjunction to control the gain distribution of a modulated signal in a receiver. Each of the first amplifier circuit and the second amplifier circuit is associated with a particular gain profile that may be dynamically adjusted by the gain control circuit based upon a measured quality indicator of the modulated signal. In this regard, the receiver optimizes the quality of reception of the modulated signal despite the presence of strong adjacent channels. This adjustment to the gain profiles based upon the determined quality indicator can be done faster than if the adjustments are made solely upon the use of a quality indicator of a demodulated signal, such as the Bit Error Rate (BER) for digital signals. Moreover, the adjustments to the gain profiles are performed in small increments or decrements so that the gain control circuit can maintain a lock on the modulated signal.

These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
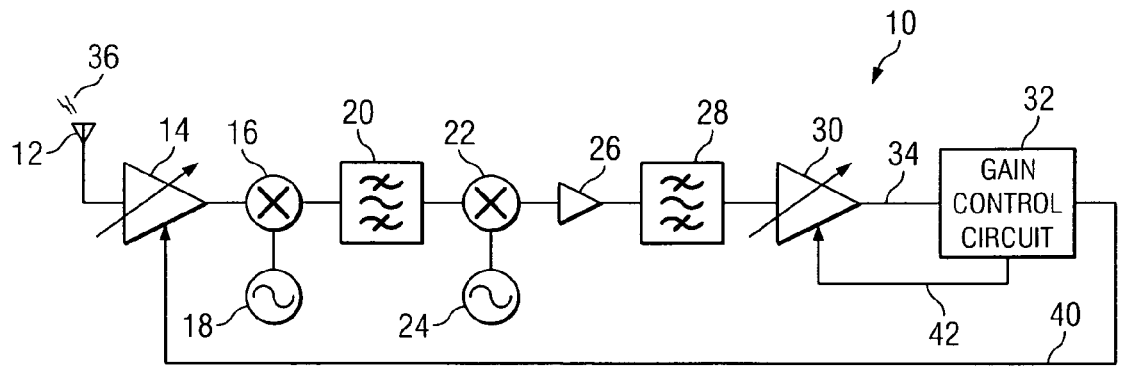
FIG. 1 illustrates a receiver in accordance with one embodiment of the present invention.

FIG. 1 illustrates one embodiment of a receiver 10 that includes an input device 12 coupled to a first amplifier circuit 14. Although FIG. 1 is illustrated and detailed with respect to a particular dual conversion tuner architecture for receiver 10, it should be understood that any suitable single, dual, or direct conversion tuner architecture may be used for receiver 10 without departing from the scope of this disclosure. Therefore, while a particular example of receiver 10 is illustrated and described herein, other architectures for receiver 10 are applicable. Referring to FIG. 1, a first mixer 16 is coupled to first amplifier circuit 14 and a first local oscillator 18. A first filter 20 is coupled to first mixer 16 and a second mixer 22, which is further coupled to a second local oscillator 24. An amplifier 26, such as a low noise amplifier (LNA), couples second mixer 22 to a second filter 28. Receiver 10 further comprises a second amplifier circuit 30 coupled to second filter 28. A gain control circuit 32 is coupled to first amplifier circuit 14 and second amplifier circuit 30. In general, first amplifier circuit 14 and second amplifier circuit 30 operate in conjunction to control the gain distribution of a signal 34 in receiver 10. Each of first amplifier circuit 14 and second amplifier circuit 30 are associated with a particular gain profile that may be dynamically adjusted by gain control circuit 32 based upon a quality indicator of signal 34. In this regard, receiver 10 optimizes the quality of reception of signal 34.

Input device 12 comprises a terrestrial antenna, a cable input, a satellite dish, or any other suitable device for receiving a broadband signal 36 from a variety of sources. Signal 36 comprise video and audio data carried on analog or digital signals, such as radio frequency (RF) signals over a frequency range. In this regard, signal 36 comprises a modulated signal. In one embodiment, signal 36 comprise signals in the television band. Signal 34 comprises signal 36 after processing by the various components of receiver 10 illustrated in FIG. 1.

Figure 2A:
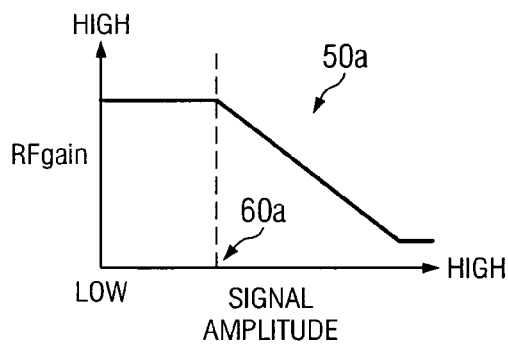
FIG. 2A illustrates a gain profile associated with a first amplifier circuit of the receiver of FIG. 1.
Figure 3A:
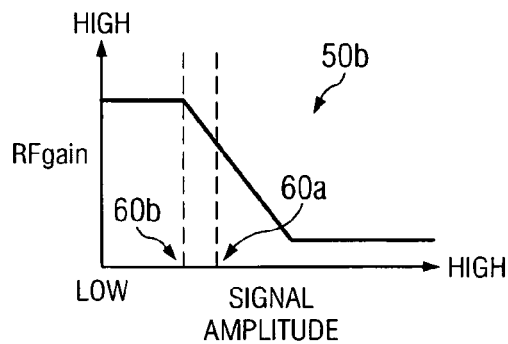
FIG. 3A illustrates an adjusted gain profile associated with the first amplifier circuit of the receiver illustrated in FIG. 1.

First amplifier circuit 14 may comprise an RF automatic gain control (AGC) amplifier having a variable gain. First amplifier circuit 14 is operated by gain control circuit 32 in association with a first gain profile as illustrated in FIGS. 2A and 3A. The first amplifier circuit 14 may be implemented as a variable gain amplifier or a variable gain attenuator in series with a fixed gain amplifier.

First mixer 16 comprises any suitable device that multiplies an RF signal received from first amplifier circuit 14 with a local oscillator (LO) signal received from a first local oscillator 18 to generate an intermediate frequency (IF) signal. Local oscillator 18 comprises any suitable device that generates a local oscillator signal at a selected frequency. In one embodiment, the local oscillator frequency associated with local oscillator 18 is selected so that mixer 16 performs an up-conversion of the RF signal received from first amplifier circuit 14.

Filter 20 comprises any suitable number and combination of frequency selective components that may be used in receiver 10. In one embodiment, filter 20 comprises a band pass filter that provides coarse channel selection of signals 36 in receiver 10. As a matter of design choice, filter 20 may be constructed on the same integrated circuit substrate as mixers 16 and 22, or filter 20 may be a discrete off-chip device. Filter 20 selects a band of channels or even a single channel from the signals 36 in the IF signal received from mixer 16.

Following filter 20, mixer 22 mixes the first IF signal with a second local oscillator signal from local oscillator 24 to generate a second IF signal. In one embodiment, mixer 22 performs a down conversion of the IF signal to a particular frequency. The second IF signal then passes through filter 28 which limits the bandwidth of the signal to a single channel by attenuating unwanted adjacent channels. In one embodiment, filter 28 comprises a surface acoustic wave (SAW) filter. The output of filter 28 is input to second amplifier circuit 30 which operates in conjunction with first amplifier circuit 14 to control the amplitude of input signal 34, and therefore the overall gain of receiver 10. Although receiver 10 is illustrated with first amplifier circuit 14 and second amplifier circuit 30, it should be understood that receiver 10 may have any suitable number, combination, and arrangement of amplifier circuits to control the amplitude of signal 34 and/or the overall gain of receiver 10. Moreover, some or all of these amplifier circuits may be controlled by gain control circuit 32 in the manner to be described herein.

Gain control circuit 32 comprises any suitable number, combination and arrangement of hardware and/or software components to determine a suitable quality indicator of signal 34 and, in response, to adjust the gain profiles of first amplifier circuit 14 and second amplifier circuit 30. Gain control circuit 32 is illustrated in further detail with respect to FIG. 4.

Suitable quality indicators of signal 34 include, but are not limited to, the Signal-to-Noise Ratio (SNR), the Error-Vector-Magnitude (EVM), the Modulation-Error-Ratio (MER), or the Mean-Square-Error (MSE) of signal 34. The SNR of signal 34 is the ratio of usable signal being transmitted to the undesired signal, or noise. Therefore, SNR is a measure of transmission quality. This ratio of signal to noise is generally expressed in decibels (dB). Qualitatively, the EVM of signal 34 is the difference between a measured signal and its ideal error-free point in the signal constellation. Quantitatively, the EVM of signal 34 is a statistical estimate of the magnitude of the error vector normalized by the magnitude of the ideal signal. The MER of signal 34 is the power ratio of an unimpaired signal to the interference affecting it. The interference can be additive noise, or it can be interference created by linear distortion, and is probably some of both in most implementations. The MSE of signal 34 comprises the average of the square of the difference between the desired signal 34 and the actual signal 34 (the error).

If the quality indicator of demodulated signal 102 goes below a predetermined threshold, then gain control circuit 32 determines a quality indicator of modulated signal 34 and adjusts the take-over-point and therewith the gain profiles of amplifier circuits 14 and 30 to decrease the overall contribution provided by first amplifier circuit 14 to the gain of receiver 10, and to increase the overall contribution provided by second amplifier circuit 30 to the gain of receiver 10, using gain control signals 40 and 42, respectively. In this regard, the gain distribution among amplifier circuits 14 and 30 is optimized in order to receive a better modulated signal 34 quality.

Upon adjusting the gain profiles of amplifier circuits 14 and 30, the quality indicator of modulated signal 34 is redetermined and, unless the quality indicator of modulated signal 34 did not improve or unless it actually degraded, then gain control circuit 32 readjusts the gain profile of amplifier circuits 14 and 30 to further improve the quality of a quality indicator of signal 34 after it is demodulated, such as signal 34. In a particular embodiment, gain control circuit 32 further determines the Bit Error Rate (BER). In this embodiment, only if the determined BER for digital signals exceeds a predetermined threshold does the gain control circuit 32 perform the adjustments described above. In other embodiments, the adjustments to the gain profiles of amplifier circuits 14 and 30 may be made according to the quality indicator of modulated signal 34 regardless of the determined BER. In still other embodiments, the adjustments to the gain profiles of amplifier circuits 14 and 30 may be made according to the determined quality indicator of modulated signal 34 upon the existence of any other suitable pre-condition associated with receiver 10.

Figure 2B:
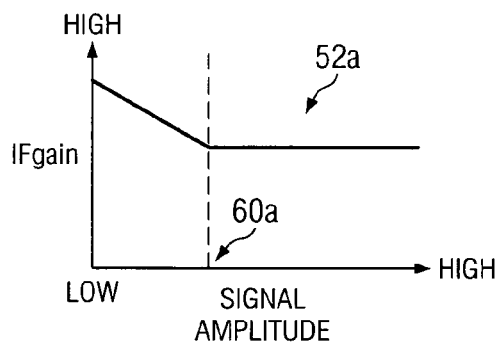
FIG. 2B illustrates a gain profile associated with a second amplifier circuit of the receiver of FIG. 1.

FIG. 2A illustrates one embodiment of a first gain profile 50a associated with first amplifier circuit 14. First gain profile 50a comprises a first gain value, RF gain, that varies according to the amplitude of signal 34. As measured according to an increasing amplitude of signal 34, from left to right across the x-axis of the graph depicted in FIG. 2A, the first gain value, RF gain, starts decreasing at a particular amplitude 60a of signal 34. FIG. 2B illustrates a second gain profile 52a associated with second amplifier circuit 30. Second gain profile 52 comprises a second gain value, IF gain, that varies according to the amplitude of signal 34. As measured according to an increasing amplitude of signal 34, from left to right across the x-axis of the graph depicted in FIG. 2B, the second gain value stops decreasing at amplitude 60a of signal 34.

Therefore, as the amplitude of signal 34 increases from low to high across amplitude 60a, the relative contributions by amplifier circuit 14 and amplifier circuit 30 to the overall gain of receiver 10 are adjusted. In particular, when the amplitude of signal 34 increases from low to amplitude 60a, the relative contribution to the overall gain of receiver 10 by second amplifier circuit 30 decreases while the relative contribution of first amplifier circuit 14 remains substantially constant. As the amplitude of signal 34 continues to increase beyond amplitude 60a, the relative contribution to the overall gain of receiver 10 by first amplifier circuit 14 decreases while the relative contribution by second amplifier circuit 30 remains substantially constant. As a result, amplitude 60a may be referred to as a "take-over-point" (TOP).

Gain control circuit 32 may be initialized to control the gain of amplifier circuits 14 and 30 using a default amplitude 60a, or a default take-over-point. This default amplitude 60a may be set according to the various characteristics of receiver 10 using factory settings. However, because receiver 10 as deployed may be affected by a number of influences on the quality of signal 34, such as by the existence of significant adjacent channel frequencies, gain control circuit 32 of receiver 10 may dynamically adjust the take-over-point for the operation of amplifier circuits 14 and 30. In particular, gain control circuit 32 may adjust the amplitude 60a at which the gain value of first amplifier circuit 14 starts decreasing and at which the gain value of second amplifier circuit 30 stops decreasing.

Figure 3B:
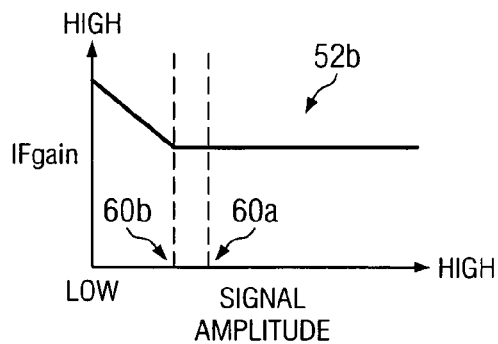
FIG. 3B illustrates an adjusted gain profile associated with the second amplifier circuit of the receiver illustrated in FIG. 1.

FIG. 3A illustrates gain profile 50b of first amplifier circuit 14 after the adjustment of the take-over-point by gain control circuit 32. In particular, gain control circuit 32 decreased the amplitude at which the gain value of first amplifier circuit 14 starts decreasing, from amplitude 60a to amplitude 60b of signal 34. FIG. 3B illustrates an adjusted gain profile 52b associated with second amplifier circuit 30. Again, gain control circuit 32 adjusted the amplitude at which the gain value of second amplifier 30 stops decreasing, from amplitude 60a to amplitude 60b of signal 34. In effect, the take-over-point, as measured by the amplitude of signal 34, was reduced from amplitude 60a to amplitude 60b. In this regard, gain control circuit 32 attempts to achieve an optimum gain distribution as between first amplifier circuit 14 and second amplifier circuit 30 within receiver 10 to achieve an optimal quality of signal 34. Gain profiles 50a and 50b may be generically referred to as gain profile 50. Gain profiles 52a and 52b may be generically referred to as gain profile 52.

Figure 4:
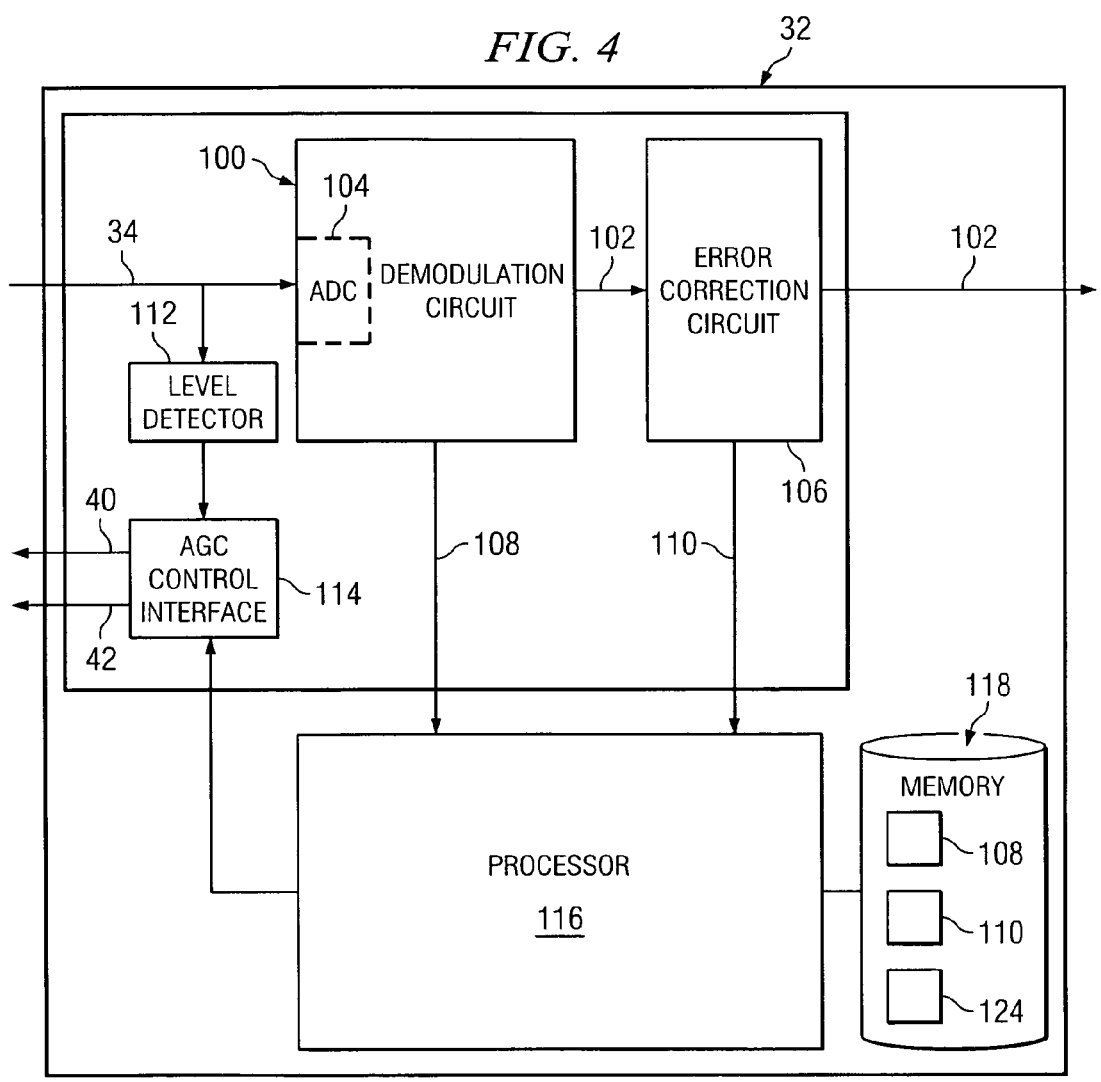
FIG. 4 illustrates one embodiment of a gain control circuit of the receiver illustrated in FIG. 1.

FIG. 4 illustrates one embodiment of gain control circuit 32 that includes a demodulator 100 that receives modulated signal 34 and outputs a demodulated signal 102. In one embodiment, demodulator 100 includes an analog-to-digital (ADC) converter 104. An error correction circuit 106 receives demodulated signal 102 and performs error correction on it. Demodulation circuit 100 also determines a quality indicator 108 of modulated signal 34. As indicated above, quality indicator 108 may comprise any one or more of the SNR, EVM, MER, or MSE associated with signal 34. Moreover, error correction circuit 106 may determine a quality indicator 110 of demodulated signal 102. As indicated above, quality indicator 110 may comprise the BER of signal 102. Gain control circuit 32 further includes a level detector 112 and an automatic gain control (AGC) control interface 114. Furthermore, a processor 116 couples to demodulation circuit 100, error correction circuit 106, and AGC control interface 114. A memory 118 couples to processor 116. Although a particular arrangement of components are illustrated for gain control circuit 32, it should be understood that any suitable number, combination, and arrangement of hardware and/or software components may be used to perform the functions of gain control circuit 32 described herein.

In operation, level detector 112 receives signal 34 and determines its amplitude. Because signal 34 can comprise a weak signal or a strong signal according to various environmental and operational conditions associated with receiver 10, the amplitude of signal 34 may need to be adjusted prior to demodulation. In this regard, level detector 112 measures the amplitude of signal 34 against a threshold amplitude and determines whether signal 34 should be amplified or attenuated prior to demodulation. For example, if signal 34 is a weak signal that is less than the threshold amplitude, level detector 112 controls AGC control interface 114 to either increase the gain of first amplifier circuit 14 using gain control signal 40, or to increase the gain of second amplifier circuit 30 using gain control signal 42. If the amplitude of signal 34 is strong such that it exceeds the threshold amplitude, level detector 112 controls AGC control interface 114 to either decrease the gain of first amplifier circuit 14 using gain control signal 40, or to decrease the gain of second amplifier circuit 30 using gain control signal 42.

AGC control interface 114 determines which of amplifiers circuits 14 or 30 to control based on the relative amplitude of signal 34 as compared to amplitude 60, also referred to as the take-over-point. For example, if the amplitude of signal 34 is less than the threshold amplitude and less than amplitude 60, then interface 114 communicates a gain control signal 42 to increase the gain of second amplifier 30. If the amplitude of signal 34 is less than the threshold amplitude but greater than amplitude 60, then interface 114 communicates a gain control signal 40 to increase the gain of first amplifier circuit 14. If the amplitude of signal 34 is greater than the threshold amplitude but less than the amplitude 60, then interface 114 communicates a gain control signal 42 to decrease the gain of second amplifier circuit 30. If the amplitude of signal 34 is greater than the threshold amplitude and greater than amplitude 60, interface 114 communicates a gain control signal 40 to decrease the gain of first amplifier circuit 14.

In addition to adjusting the gain of amplifier circuits 14 and/or 30 as described above according to the amplitude of signal 34, gain control circuit 32 may also adjust gain profiles 50 and 52 of amplifiers circuits 14 and 30, respectively, by adjusting amplitude 60 as illustrated in FIGS. 2A and 2B and FIGS. 3A and 3B. In particular, error correction circuit 106 determines a quality indicator 110 of demodulated signal 102 and communicates it to processor 116 for storage in memory 118. If processor 116 determines that the BER of signal 102 exceeds a predetermined threshold, then processor 116 initiates a process whereby amplitude 60 associated with gain profiles 50 and 52 is adjusted, such as from amplitude 60a to amplitude 60b. In one embodiment, if the BER of signal 102 does not exceed a predetermined threshold, than processor 116 does not initiate an adjustment of amplitude 60.

Demodulation circuit 100 determines a quality indicator 108 of modulated signal 34 and communicates it to processor 116 for storage in memory 118. Processor 116 then adjusts the amplitude 60 associated with gain profiles 50 and 52 from amplitude 60a to amplitude 60b. The new amplitude 60b is stored in memory 118 as take-over-point 124. In general, processor 116 adjusts amplitude 60 from amplitude 60a to amplitude 60b in small increments or decrements and in an iterative process with respect to the measurement of quality indicator 108. In particular, upon the processor 116 adjusting amplitude 60 for gain profiles 50 and 52, demodulation circuit 100 again determines quality indicator 108 of signal 34 and communicates it to processor 116 for storage in memory 118. Unless the detected quality indicator 108 of signal 34 does not improve or actually degrades, processor 116 again adjusts amplitude 60. This process is repeated until there is no improvement in quality indicator 108 of signal 34. If there is a degradation of quality indicator 108 for signal 34, then processor 116 may adjust amplitude 60 back to a previous amplitude 60, such as from amplitude 60b back to amplitude 60a, or to any intermediate amplitude 60 between amplitudes 60a and 60b. The current amplitude 60 determined by processor 116 is stored as take-over-point 124 in memory 118. By adjusting amplitude 60 in small increments or decrements, gain control circuit 32 can perform the appropriate measurements and adjustments in sufficient time to maintain a lock on signal 34.

If the adjustment to amplitude 60 associated with gain profiles 50 and 52 results in an acceptable quality indicator 110, such as BER of signal 102 that is less than a threshold BER, then processor 116 stops the adjustment of amplitude 60 described herein. If a later signal 34 again results in an unacceptable quality indicator 110, such as a BER that exceeds a threshold BER, gain control circuit 32 again adjusts amplitude 60, the take-over-point, of gain profiles 50 and 52 as described herein.

Figure 5:
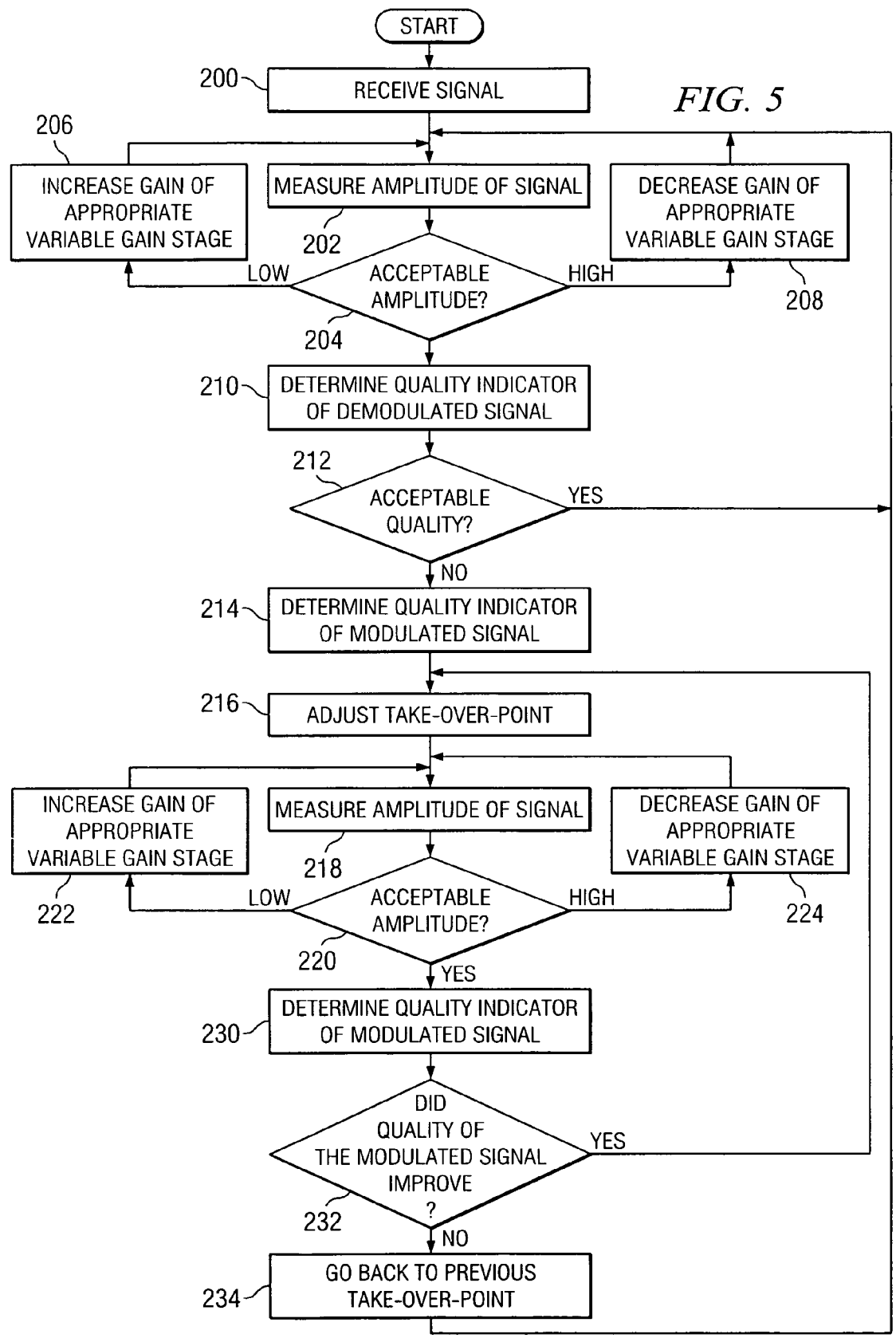
FIG. 5 illustrates a flow chart for a method of operating the receiver illustrated in FIG. 1.

FIG. 5 illustrates one embodiment of a method for operating receiver 10. At step 200, gain control circuit 32 receives modulated signal 34. At step 202, level detector 112 measures the amplitude of signal 34. Execution proceeds to step 204 where level detector 112 determines whether the amplitude of signal 34 is acceptable. If the amplitude of signal 34 is too low, execution proceeds to step 206 where AGC control interface 114 communicates control signals 40 and/or 42 to increase the gain of the appropriate ones of amplifier circuits 14 and/or 30. If it is determined at step 204 that the amplitude of signal 34 is too high, execution proceeds to step 208 where AGC control interface 114 communicates control signals 40 and/or 42 to decrease the gain of the appropriate ones of amplifier circuits 14 and/or 30. If the amplitude of signal 34 is deemed acceptable as determined at step 204, then execution proceeds to step 210 where error correction circuit 106 determines quality indicator 110 of the demodulated signal 102. If the quality of signal 102 is deemed acceptable at step 212, execution returns to step 202. If the quality of signal 102 is not acceptable, as determined at step 212, execution proceeds to step 214.

At step 214, the modulation circuit 100 determines quality indicator 108 of modulated signal 34. At step 216, processor 116 adjusts the take-over-point associated with gain profiles 50 and 52 in small increments or decrements such that gain control circuit 32 may maintain a lock on signal 34. Upon adjusting the take-over-point of gain profiles 50 and 52 at step 216, execution proceeds to step 218 where level detector 112 again measures the amplitude of signal 34. Execution proceeds to step 220 where level detector 112 again determines whether the amplitude of signal 34 is acceptable. If the amplitude of signal 34 is determined to be too low, execution proceeds to step 222 where AGC control interface 114 communicates control signals 40 and/or 42 to increase the gain of the appropriate ones of amplifier circuits 14 and/or 30. If the amplitude of signal 34 is determined to be too high at step 220, execution proceeds to step 224 where AGC control interface 114 communicates control signals 40 and/or 42 to decrease the gain of the appropriate ones of amplifier circuits 14 and/or 30. If the amplitude of signal 34 is determined to be acceptable at step 220, execution proceeds to step 230 where demodulation circuit 100 again determines quality indicator 108 of modulated signal 34. Execution proceeds to step 232 where processor 116 determines whether the quality of the modulated signal 34 improved. If so, execution returns to step 216 where take-over-point of gain profiles 50 and 52 is again adjusted. If the quality of modulated signal 34 was determined not to have improved at step 232, execution proceeds to step 234 where processor 116 returns the take-over-point of gain profile 50 and 52 to a previous take-over-point. Execution then returns to step 202.

Many of the steps in the preceding flowchart may take place simultaneously and/or in different orders than as shown. For example, receiver 10 may use methods with additional steps, fewer steps, and/or different steps, so long as the methods remain appropriate.

Although the present invention has been described in detail, it should be understood that various changes, substitutions and alterations can be made hereto without departing from the scope of the invention as defined by the appended claims.

What is claimed is:

1. A receiver for processing a signal, comprising:
   a first amplifier circuit that is operated in association with a first gain profile;
   a second amplifier circuit that is operated in association with a second gain profile, wherein the first amplifier circuit and the second amplifier circuit provide relative contributions to an overall gain value of the receiver and the relative contributions to the overall gain value of the receiver change from the first amplifier circuit to the second amplifier circuit at a take-over-point, the take-over-point comprising a particular amplitude of a modulated signal;
   a gain control circuit, comprising:
      a level detector;
      a demodulation circuit that determines a first quality indicator associated with the modulated signal and demodulates the modulated signal to create a demodulated signal;
      an error correction circuit that determines a second quality indicator associated with the demodulated signal; and
      a processor that adjusts the first gain profile and the second gain profile by adjusting the take-over-point from a first amplitude of the modulated signal to a second amplitude of the modulated signal based at least in part upon the determined first quality indicator, only if the second quality indicator exceeds a predetermined threshold.

2. The receiver of claim 1, wherein the modulated signal comprises a television signal.

3. The receiver of claim 1, wherein:
   the first amplifier circuit comprises a radio frequency amplifier; and
   the second amplifier circuit comprises an intermediate frequency amplifier.

4. The receiver of claim 1, wherein:
   the first gain profile comprises a first gain value that varies according to an amplitude of the modulated signal; and
   the second gain profile comprises a second gain value that varies according to the amplitude of the modulated signal.

5. The receiver of claim 4, wherein as measured according to an increasing amplitude of the modulated signal:
   the first gain value starts decreasing at a particular amplitude of the modulated signal; and
   the second gain value stops decreasing at the particular amplitude of the modulated signal.

6. The receiver of claim 5, wherein the processor adjusts the first gain profile and the second gain profile by adjusting the particular amplitude of the modulated signal at which the first gain value starts decreasing and the second gain value stops decreasing.

7. The receiver of claim 6, wherein:
   upon adjusting the first and second gain profiles, the demodulation circuit redetermines the first quality indicator associated with the modulated signal; and
   unless the redetermined first quality indicator has not improved or has degraded, the processor readjusts the first gain profile and the second gain profile based at least in part upon the redetermined first quality indicator.

8. The receiver of claim 6, wherein the processor adjusts the first gain profile by adjusting a first gain control signal applied to the first amplifier circuit and adjusts the second gain profile by adjusting a second gain control signal applied to the second amplifier circuit.

9. The receiver of claim 8, wherein the adjustments to the first gain control signal and the second gain control signal are made in small increments or decrements so as to maintain a lock on the modulated signal.

10. The receiver of claim 5, wherein the processor adjusts the first gain profile and the second gain profile by decreasing the particular amplitude of the modulated signal at which the first gain value starts decreasing and the second gain value stops decreasing.

11. The receiver of claim 1, wherein the level detector is operable to determine an amplitude of the modulated signal, wherein the gain control circuit is further operable to adjust a gain value associated with at least one of the first amplifier circuit and the second amplifier circuit based at least in part upon the determined amplitude of the modulated signal.

12. The receiver of claim 1, wherein the first quality indicator of the modulated signal comprises at least one of:
    a signal-to-noise ratio associated with the modulated signal;
    an error-vector-magnitude associated with the modulated signal;
    a modulation-error-ratio associated with the modulated signal; and
    a mean-square-error associated with the modulated signal.

13. A method for processing a signal, comprising:
    operating a first amplifier circuit in association with a first gain profile;
    operating a second amplifier circuit in association with a second gain profile, wherein the first amplifier circuit and the second amplifier circuit provide relative contributions to an overall gain value of the receiver and the relative contributions to the overall gain value of the receiver change from the first amplifier circuit to the second amplifier circuit at a take-over-point, the take-over point comprising a particular amplitude of a modulated signal;
    determining a first quality indicator associated with the modulated signal;
    demodulating the modulated signal to create a demodulated signal;
    determining a second quality indicator associated with the demodulated signal; and
    adjusting the first gain profile and the second gain profile by adjusting the take-over-point from a first amplitude of the modulated signal to a second amplitude of the modulated signal based at least in part upon the determined first quality indicator, only if the second quality indicator exceeds a predetermined threshold.

14. The method of claim 13, wherein the modulated signal comprises a television signal.

15. The method of claim 13, wherein:
    the first amplifier circuit comprises a radio frequency amplifier; and
    the second amplifier circuit comprises an intermediate frequency amplifier.

16. The method of claim 13, wherein:
    the first gain profile comprises a first gain value that varies according to an amplitude of the modulated signal; and
    the second gain profile comprises a second gain value that varies according to the amplitude of the modulated signal.

17. The method of claim 16, wherein as measured according to an increasing amplitude of the modulated signal:
    the first gain value starts decreasing at a particular amplitude of the modulated signal; and
    the second gain value stops decreasing at the particular amplitude of the modulated signal.

18. The method of claim 17, wherein adjusting the first gain profile and the second gain profile comprises adjusting the particular amplitude of the modulated signal at which the first gain value starts decreasing and the second gain value stops decreasing.

19. The method of claim 18, further comprising:
    upon adjusting the first and second gain profiles, redetermining the first quality indicator associated with the modulated signal; and
    unless the redetermined first quality indicator has not improved or has degraded, readjusting the first gain profile and the second gain profile based at least in part upon the redetermined first quality indicator.

20. The method of claim 18, wherein:
    adjusting the first gain profile comprises adjusting a first gain control signal applied to the first amplifier circuit; and
    adjusting the second gain profile comprises adjusting a second gain control signal applied to the second amplifier circuit.

21. The method of claim 20, wherein the adjustments to the first gain control signal and the second gain control signal are made in small increments or decrements so as to maintain a lock on the modulated signal.

22. The method of claim 17, wherein adjusting the first gain profile and the second gain profile comprises decreasing the particular amplitude of the modulated signal at which the first gain value starts decreasing and the second gain value stops decreasing.

23. The method of claim 13, further comprising:
    determining an amplitude of the modulated signal; and
    adjusting a gain value associated with at least one of the first amplifier circuit and the second amplifier circuit based at least in part upon the determined amplitude of the modulated signal.

24. The method of claim 13, wherein the first quality indicator of the modulated signal comprises at least one of:
    a signal-to-noise ratio associated with the modulated signal;
    an error-vector-magnitude associated with the modulated signal;
    a modulation-error-ratio associated with the modulated signal; and
    a mean-square-error associated with the modulated signal.

25. A receiver for processing a signal, comprising:
    a first amplifier circuit that is operated in association with a first gain;
    a second amplifier circuit that is operated in association with a second gain, wherein the first amplifier circuit and the second amplifier circuit provide relative contributions to an overall gain value of the receiver and the relative contributions to the overall gain value of the receiver change from the first amplifier circuit to the second amplifier circuit at a take-over-point, the take-over-point comprising a particular amplitude of a modulated signal;
    a gain control circuit that:
        determines a first quality indicator associated with a modulated signal;
        demodulates the modulated signal to create a demodulated signal;
        determines a second quality indicator associated with the demodulated signal; and
        adjusts the first gain and the second gain by adjusting the take-over-point from a first amplitude of the modulated signal to a second amplitude of the modulated signal based at least in part upon the determined first quality indicator, only if the second quality indicator exceeds a predetermined threshold.

26. The receiver of claim 25, wherein the modulated signal comprises a television signal.

27. The receiver of claim 25, wherein:
the first amplifier circuit comprises a radio frequency amplifier; and
the second amplifier circuit comprises an intermediate frequency amplifier.

28. The receiver of claim 25, wherein:
the first gain varies according to an amplitude of the modulated signal; and
the second gain varies according to the amplitude of the modulated signal.

29. The receiver of claim 28, wherein as measured according to an increasing amplitude of the modulated signal:
the first gain starts decreasing at a particular amplitude of the modulated signal; and
the second gain stops decreasing at the particular amplitude of the modulated signal.

30. The receiver of claim 29, wherein the gain control circuit adjusts the first gain and the second gain by adjusting the particular amplitude of the modulated signal at which the first gain starts decreasing and the second gain stops decreasing.

31. The receiver of claim 30, wherein:
upon adjusting the first gain and the second gain, the gain control circuit redetermines the first quality indicator associated with the modulated signal; and
unless the redetermined first quality indicator has not improved or has degraded, the gain control circuit readjusts the first gain and the second gain based at least in part upon the redetermined first quality indicator.

32. The receiver of claim 30, wherein the gain control circuit adjusts the first gain by adjusting a first gain control signal applied to the first amplifier circuit and adjusts the second gain by adjusting a second gain control signal applied to the second amplifier circuit.

33. The receiver of claim 32, wherein the adjustments to the first gain control signal and the second gain control signal are made in small increments or decrements so as to maintain a lock on the modulated signal.

34. The receiver of claim 29, wherein the gain control circuit adjusts the first gain and the second gain by decreasing the particular amplitude of the modulated signal at which the first gain starts decreasing and the second gain stops decreasing.

35. The receiver of claim 25, wherein the gain control circuit is further operable to determine an amplitude of the modulated signal, wherein the gain control circuit is further operable to adjust a gain associated with at least one of the first amplifier circuit and the second amplifier circuit based at least in part upon the determined amplitude of the modulated signal.

36. The receiver of claim 30, wherein the first quality indicator of the modulated signal comprises at least one of:
a signal-to-noise ratio associated with the modulated signal;
an error-vector-magnitude associated with the modulated signal;
a modulation-error-ratio associated with the modulated signal; and
a mean-square-error associated with the modulated signal.

* * * * *